United States Patent
Rostoker et al.

[11] Patent Number: 6,078,502
[45] Date of Patent: Jun. 20, 2000

[54] SYSTEM HAVING HEAT DISSIPATING LEADFRAMES

[75] Inventors: Michael D. Rostoker, Boulder Creek; Nicholas F. Pasch, Pacifica; Joe Zelayeta, Saratoga, all of Calif.

[73] Assignee: LSI Logic Corporation, Milpitas, Calif.

[21] Appl. No.: 08/627,411

[22] Filed: Apr. 1, 1996

[51] Int. Cl.[7] .................................................. H05K 7/20
[52] U.S. Cl. ............................................ 361/723; 257/675
[58] Field of Search ................................. 174/16.3, 52.4; 257/666, 669, 674, 675, 676, 691, 735, 747; 361/704, 707, 723, 813

[56] References Cited

U.S. PATENT DOCUMENTS

| | | | |
|---|---|---|---|
| 4,862,245 | 8/1989 | Pashby et al. | 257/675 |
| 5,299,091 | 3/1994 | Hoshi et al. | 361/723 |
| 5,331,200 | 7/1994 | Teo et al. | 257/666 |
| 5,532,905 | 7/1996 | Moore | 257/675 |

*Primary Examiner*—Gregory D. Thompson

[57] ABSTRACT

Electronic system utilizing semiconductor devices having heat dissipating leadframes are provided by using materials, such as copper, which exhibit good thermal and electrical conductivity, and arranging the lead fingers of the leadframe in a configuration which provides good thermal coupling with the surface of a semiconductor die. Micro-bump bonding techniques are employed to provide additional thermal coupling at the electrical connection point of the leadframe fingers to the die. Leadframe fingers exhibiting a high aspect ratio (height:width) are described. Leadframe fingers extending substantially beyond interior bond pads are described.

25 Claims, 12 Drawing Sheets

SYSTEM HAVING HEAT DISSIPATING LEADFRAMES

BACKGROUND OF THE INVENTION

1. Field of the Invention

The present invention relates to electronic systems utilizing electronic device packaging techniques, and more particularly to electronic systems utilizing plastic, leadframe-type packages.

2. Description of the Related Technology

Electronic systems utilizing semiconductor devices such as integrated circuits have revolutionized the way modem society works and lives by making possible a level of technological sophistication unknown in the days of vacuum tubes and even discrete transistors. These electronic systems, which are building blocks for ever larger and more complex systems such as machines used in manufacture, transportation and the like. The sophistication of these electronic systems is the result of the complex functions handled by semiconductor devices, such as integrated circuits, making up the electronic system. An integrated circuit may comprise, on a small silicon chip, many thousand or even a million or more transistors, including associated diodes, resistors and capacitors, interconnected together to form complex electronic functions.

As used herein, the term "semiconductor device" refers to discrete or integrated circuit devices such as a silicon chip or die containing circuitry, and the term "semiconductor device package" refers to the associated packaging generally used for containing the semiconductor device (e.g., chip), including leads such as for connecting to a socket or a circuit board, and internal connections, such as bond wires or solder bump (micro-bump) connections, of the die to the leads.

In a typical modern semiconductor device package, a semiconductor die (device) is disposed within a package and is connected to conductive leads of the semiconductor device package by means of bond wires or "solder bump" (micro-bump) connections. The connections to the semiconductor die are typically accomplished via metallic connection points or "bond pads" (I/O pads) disposed on a planar surface of the die, around the periphery (along the edges) thereof in a "peripheral area". The peripheral area is a ring-shaped area on the surface of the die, essentially a narrow band between the edges of the die and the "interior area" of the die. The conductive leads of the semiconductor device package may be provided by a leadframe, such as in a molded plastic or TAB (Tape Automated Bonding) semiconductor device package, or by printed traces, such as in a ceramic or overmolded printed circuit board package. The conductive leads approach the semiconductor die within the semiconductor device package in a generally radial ("fan-in") pattern.

Typically, a leadframe is stamped (or etched) from a sheet of conductive material, simultaneously forming all of the conductive leads of the leadframe. Often, the leadframe is held together by sacrificial "bridges" between the leads, which are removed after the leadframe is assembled to a die and a package body is formed. The leads are then effectively separate. However, by virtue of their common mounting within a package body, they continue to behave as a unit. Alternatively, the leads can be formed on a non-conductive substrate, such as mylar, to form a tape automated bonding (TAB) packaged chip.

As the circuitry on a die operates, it dissipates power and heats up the die. Often, there is a mismatch between the thermal coefficients of expansion (TCE) of a semiconductor die and the leadframe (and package body) to which it is attached. This is especially troublesome where solder bump (micro-bump) connections are used to connect the die to the leadframe. (It is assumed that the heating of the die as it operates is fairly uniform). Generally, as temperature rises, the die expands about its "centroid" (center of mass) or around a circuit element that produces heat, as do the leadframe and package body. However, the die expands at a different rate than the leadframe and package body, causing a great deal of mechanical stress at the interface between the leadframe and the bond pads (the solder bump connections). This stress creates a tendency of the bond pads to tear away from the die, resulting in a failed device.

Clearly, if heat can be carried away from the die at a sufficient rate, much of the thermal expansion can be prevented, and consequent undesirable behavior avoided. The package body itself is typically thermally coupled to the semiconductor die, and acts to some degree as a heat sink. Many techniques are known in the art for drawing heat away from a packaged semiconductor device, and typically include a separate heat sink element. However, present heat-sinking techniques are generally either elaborate or only partially effective. Some such techniques attempt to provide a high degree of thermal coupling of a large thermal mass, such as a finned heat sink, directly to the die. These techniques are often cumbersome, expensive, and tend to dramatically increase the size (and cost) of the semiconductor package.

Other techniques are directed to drawing heat away from the exterior of the semiconductor device package. Such techniques are often less expensive, but still tend to increase the effective size of the package. Further, while some measure of cooling (heat draw) is provided by these techniques, there is a thermal resistance between the semiconductor die and the package body which can permit, in many cases, a significant difference between the die temperature and the temperature at the exterior of the package body.

On any thermally expanding body, the further a point on the body is from the centroid, the greater the absolute distance it travels (displaces) during expansion. Since semiconductor dies are typically rectangularly shaped and the bond pads are typically disposed along the edges of the rectangular shape (in the peripheral area), the bond pads undergo a fairly large amount of absolute displacement as compared to points located closer to the center of the die. Any bond pads located at the corners of the die, being furthest from the centroid, undergo the greatest displacement during thermal expansion. As a consequence of the absolute thermal displacements that any two different points undergo on the surface of the die, they undergo differential thermal displacements relative to one another. The further from one another that any two points on the surface of an expanding die are, the greater the differential thermal displacement between them. The leadframe and package body combination also expands about its centroid, albeit at a different rate. The center of expansion of the leadframe/package body combination is generally located fairly close to the centroid of the die, since the die is the heat source which causes the expansion. As a result, any differential thermal displacement causing mechanical stress at the bond pads of a semiconductor device is greatest at the corners of the die. The common practice of disposing bond pads along the edges of the die, therefore, would seem to create the worst possible circumstances from the point of view of thermal expansion.

One of the most significant reasons that bond pads are typically disposed about the edges (periphery) of a die is that it permits a relatively large number of I/O connections to the die without causing connections to cross one another. Current trends are towards providing smaller bond pads so that even greater numbers of connections to the die may be accommodated. Unfortunately, such smaller connections (i.e., smaller bond pads) tend to be even more fragile than "ordinary" (larger) size connections, making such techniques even more prone to thermal stress problems and device failure.

Another problem with locating bond pads along the periphery of a die is that many of the connections are made to circuitry that lies well within the interior of the die, requiring that the signals from that circuitry must travel a relatively great distance within the die along the die's minute wiring structures (conductive lines) before they reach the bond pad connections at the periphery of the die. Hence, a "pad buffer" circuit is usually provided at or near a bond pad associated with an output signal on order to buffer the output signal at the bond pad. This can contribute to timing "skew," or differences in signal timing due to different wiring delays, particularly for very high speed circuits. The wiring structures (conductive lines) with a die are extremely small and exhibit relatively high resistance. Even a tiny bond wire is a massive conductor compared to the relatively tiny interconnections on a die.

Attention is directed to the following U.S. Patents, incorporated herein by reference, and of general interest with respect to leadframe-type semiconductor device packages and methods of manufacture: U.S. Pat. No. 4,701,999, issued Oct. 27 1987 to Palmer; U.S. Pat. No. 4,774,635, issued Sep. 27, 1988 to Greenberg et al.; U.S. Pat. No. 4,894,704, issued Jan. 16,1990 to Endo; U.S. Pat. No. 4,897,602, issued Jan. 30, 1990 to Lin et al.; and U.S. Pat. No. 5,051,813, issued Sep. 24, 1991 to Schneider et al.

Attention is further directed to the following U.S. Patents, incorporated herein by reference, and of general interest with respect to micro-bump (e.g., solder bump) bonding: U.S. Pat. No. 3,429,040, issued Feb. 25, 1969 to Miller; U.S. Pat. No. 3,811,186, issued May 21, 1974 to Larnerd et al.; U.S. Pat. No. 3,871,014, issued Mar. 11, 1975 to King et al.; U.S. Pat. No. 3,984,860, issued Oct. 5, 1976 to Logue; U.S. Pat. No. 4,190,855, issued Feb. 26, 1980 to Inoue; U.S. Pat. No. 4,772,936, issued Sep. 20, 1988 to Reding et al.; U.S. Pat. No. 4,803,546, issued Feb. 7, 1989 to Sugimoto et al.; U.S. Pat. No. 4,825,284, issued Apr. 25, 1989 to Soga et al.; U.S. Pat. No. 4,926,241, issued May 15, 1990 to Carey; and U.S. Pat. No. 4,970,575, issued Nov. 13, 1990 to Soga et al.

Other information relating to microbump bonding techniques may be found in Japanese Patent number 61-145838A issued on Jul. 3, 1986 to Kishio Yokouchi, and in "LED Array Modules by New Technology Microbump Bonding Method," by Hatada, Fujimoto, Ochi, and Ishida, IEEE Trans. Comp., Hybrids, and Manuf Tech., Volume 13 no. 3, Sep. 1990, incorporated by reference herein.

OBJECTS OF THE INVENTION

It is therefore an object of the present invention to provide an electronic system which utilizes a technique for drawing heat away from a packaged semiconductor die so as to improve the reliability of the package and the overall system.

It is a further object of the present invention to provide an electronic system which has heat-sinking capabilities directly to (integrally with) a packaged semiconductor die.

It is a further object of the present invention to provide an electronic system having a technique for minimizing thermally created stresses at bond pad interfaces to semiconductor dies so as to improve the reliability of the package and the overall system.

It is a further object of the present invention to accomplish the foregoing objects at minimal additional cost over that of present leadframe-type packages.

It is a further object of the present invention to accomplish the foregoing objects with minimal package and system complexity.

SUMMARY OF THE INVENTION

The above and other objects of the present invention are satisfied, at least in part, by providing an electronic system that uses an integrated circuit packaging technique that limits the thermal stresses imposed on a semiconductor die by removing heat from the die with a thermally conductive leadframe. According to the invention, heat is removed from a semiconductor die by means of a thermally conducting leadframe, which leadframe is oriented and formed to provide a substantial improvement in thermal conductive properties relative to conventional leadframes.

According to the invention, it is posited that differential thermal displacements between points on a body due to thermal expansion of the body are proportional to the distance between the points. It is further posited that the absolute thermal displacement of a point on a body relative to the thermal center of expansion is proportional to the distance between the point and the thermal center of expansion. Also, if two bodies have different thermal coefficients of expansion and are thermally coupled at a point near their respective centroids, then differential thermal displacement and absolute thermal displacements between points on the different bodies will behave similarly.

By removing heat from the die, as close to the source as possible, the driving force behind the thermal displacements of the bond pads is significantly reduced, lessening the probability of a thermally induced failure, e.g., break-away of a bond pad (or connection to the bond pad) from the die.

Also, according to the invention, differential thermal displacements of bond pads on a die (either relative to one another or relative to corresponding conductive leads of a leadframe) are minimized by arranging the bond pads in a linear configuration, which does not expand (displace thermally) significantly in a direction lateral to the linear configuration of the bond pads. In other words, any thermal migration of the bond pads is controlled in a prescribed dimension (e.g., versus in two dimensions).

Further, according to the invention, if circuits on a semiconductor die are located distant from the desired "interior" bond pad locations, that existing and/or extra wiring (metallization) layers may be employed to provide connection between these circuits and bond pads at the desired locations. This is particularly useful in applying the present inventive technique to semiconductor dies which were originally laid out (designed) for bond pads in the peripheral area. Existing and/or additional wiring layers may be employed to route signals from the original (designed) bond pad positions to the new ("desired", according to the present invention) interior bond pad positions.

In one embodiment of the semiconductor device of the invention, a semiconductor device package provides a heat-dissipating leadframe. The package comprises a package body, a semiconductor die disposed within the package body, a row of bond pads disposed along a line on the planar surface of the semiconductor die, and a leadframe formed of a thermally and electrically conductive material and including a first group and a second group of leadframe fingers. The first and second groups of leadframe fingers are substantially co-planar with one another. The row of bond pads is oriented along the longitudinal dimension of the die. Each of the first group of leadframe fingers approaches the row of bond pads from a first lateral direction, from an edge of the die across the surface of the die and extends over a corresponding bond pad. Each of the second group of leadframe fingers approaches the row of bond pads from a second lateral direction, opposite the first lateral direction, across the surface of the die and extends to or over a corresponding bond pad. The first group and second group of leadframe fingers extend towards each other and form an interleaved pattern on or over the row of bond pads. A micro-bump connection is formed between each leadframe finger and the corresponding bond pad. The line of bond pads is transverse to the longitude of the leadframe fingers, so that thermally-induced migration of the bond pads along the line (row) is accommodated by the relative lateral resilience of the leadframe fingers (versus the leadframe fingers relatively stiff mechanical resistance in their longitudinal extent).

According to one aspect of the invention, the thermally and electrically conductive material from which the leadframe is formed is copper or a copper alloy, which is a good conductor of heat and of electrical currents.

According to another aspect of the invention, each leadframe finger has a height to width ratio of greater than 1:2.

According to another aspect of the invention, each leadframe finger has a height to width ratio of greater than 2:3.

According to another aspect of the invention, each leadframe finger has a height to width ratio of greater than 3:4.

According to another aspect of the invention, each leadframe finger has a height to width ratio of greater than 7:8.

According to another aspect of the invention, each leadframe finger has a height to width ratio of greater than 1.1:1.

According to another aspect of the invention, each leadframe finger has a height to width ratio of greater than 1.3:1.

According to another aspect of the invention, each leadframe finger has a height to width ratio of greater than 1.5:1.

According to another aspect of the invention, each leadframe finger has a height to width ratio of greater than 2:1.

According to an aspect of the invention, each leadframe finger extends from an edge of the die, past its respective micro-bump connection with the corresponding bond pad across, further across the die (towards the opposite edge of the die), spanning at least a remaining portion of the lateral dimension across the substantially planar surface of the semiconductor die. In other words, each leadframe finger spans (in aggregate, from the edge of the die past the bond pad) greater than 50% of the lateral distance across the die.

According to another aspect of the invention, the leadframe fingers span at least 60% of the lateral distance across the die, or approximately 10% further than necessary to connect to a centrally-located bond pad.

According to another aspect of the invention, the leadframe finger spans at least 70% of the lateral distance across the die.

According to another aspect of the invention, the leadframe finger spans at least 80% of the lateral distance across the die.

According to another aspect of the invention, the leadframe finger spans at least 90% of the lateral distance across the die.

According to another aspect of the invention, the leadframe finger spans at least 100% of the lateral distance (i.e., entirely) across the die.

According to another aspect of the invention, any leadframe finger may connect to more than one bond pad to improve the thermal conductivity between the leadframe finger and the die.

According to another aspect of the invention, where multiple bond pad connections are formed with a single leadframe finger, one or more of the bond pads may be "dummy" bond pads which make no electrical connection to circuitry within the die and which are provided only to improve thermal conductivity between the die and the leadframe finger.

It is contemplated that the present invention may utilize system level products comprising single chip modules (SCM) often including other electrical components (such as capacitors, resistors, inductors, etc.); multi-chip modules (MCM) having at least two integrated circuit dice in the same or separate ceramic, resin, or substrate board packages, with or without other electrical components; board level products (BLP) such as those having multiple integrated circuits on printed wiring board(s) (PWB); and box level products (Boxes) which may include a combination of elements from the list of SCM, MCM, BLP and the like. One or more of such SCM, MCM, PWB or BLP's may act as, or be integrated into a functional system or subsystem. The system level products contemplated include digital (or other) data storage systems; security and surveillance systems, general purpose computers (such as personal computers, work stations, servers, mini computers, mainframe computers and super computers); digital audio and video compression and transmission systems; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications systems (such as PBX, telephone switching, voice mail, auto attendant, network controllers, video teleconferencing, digital data transmission (such as token ring, ethernet, ATM, or the like), and including subsystems or subassemblies for inclusion or attachment to more complex system level products.

Other and further objects, features and advantages will be apparent from the following description of a presently preferred embodiment of the invention, given for the purpose of disclosure and taken in conjunction with the accompanying drawings.

DETAILED DESCRIPTION OF THE PREFERRED EMBODIMENTS

The present invention is an electronic system having at least one semiconductor die wherein heat therefrom is effectively removed by means of a thermally conducting leadframe that is oriented and formed so as to provide improved thermal conductive properties relative to a conventional leadframe.

According to the invention, it is posited that if an array of bond pads on a semiconductor die is tightly (closely) grouped (arranged or clustered) together, in a small area, then the amount of differential thermal expansion between those bond pads will be correspondingly small, and that if the small array of bond pads is located close to the centroid of the die, then the absolute thermal displacement of the bond pads will be correspondingly small.

Similarly, if the ends of the conductive leads of a leadframe form a small pattern, the differential thermal displacement of the ends of the leads will be correspondingly small. Also, if the small pattern formed by the ends of the conductive leads is located close to the center of expansion of the leadframe, then the absolute thermal displacement of the ends of the conductive leads will be correspondingly small. According to the invention, these principles may be used to great advantage in the packaging of semiconductor dies.

It is further posited, according to the present invention, that leadframe fingers (conductive leads) may serve as effective means for dissipating heat provided that:

a) the leadframe fingers are made of a highly conductive (to heat) material, such as copper or a copper alloy;

b) the leadframe fingers are sufficiently large (especially in cross-section) that they have a significant thermal mass; and/or c) the leadframe fingers extend beyond the bond pads over the surface of the die to provide additional thermal mass as well as to present additional "heat-gathering" surface area in close proximity to the die.

While the industry trend is largely towards increasing the number of connections to a semiconductor die, certain types of semiconductor devices, despite great complexity, do not require large numbers of I/O connections. One example of this type of semiconductor device is any type of memory device (e.g., ROMs, RAMs, including dynamic RAM and static RAM, etc.). Memory devices are highly repetitive arrays of circuitry with a relatively small number of I/O connections thereto. In cases such as these, there is no compelling need to use the large bond pad capacity of the periphery of the die. According to the invention, it is extremely advantageous (from a thermal expansion point of view) to locate the bond pads along a line passing through (over) the centroid of the die, or at least substantially close to the centroid.

Figure 1A:
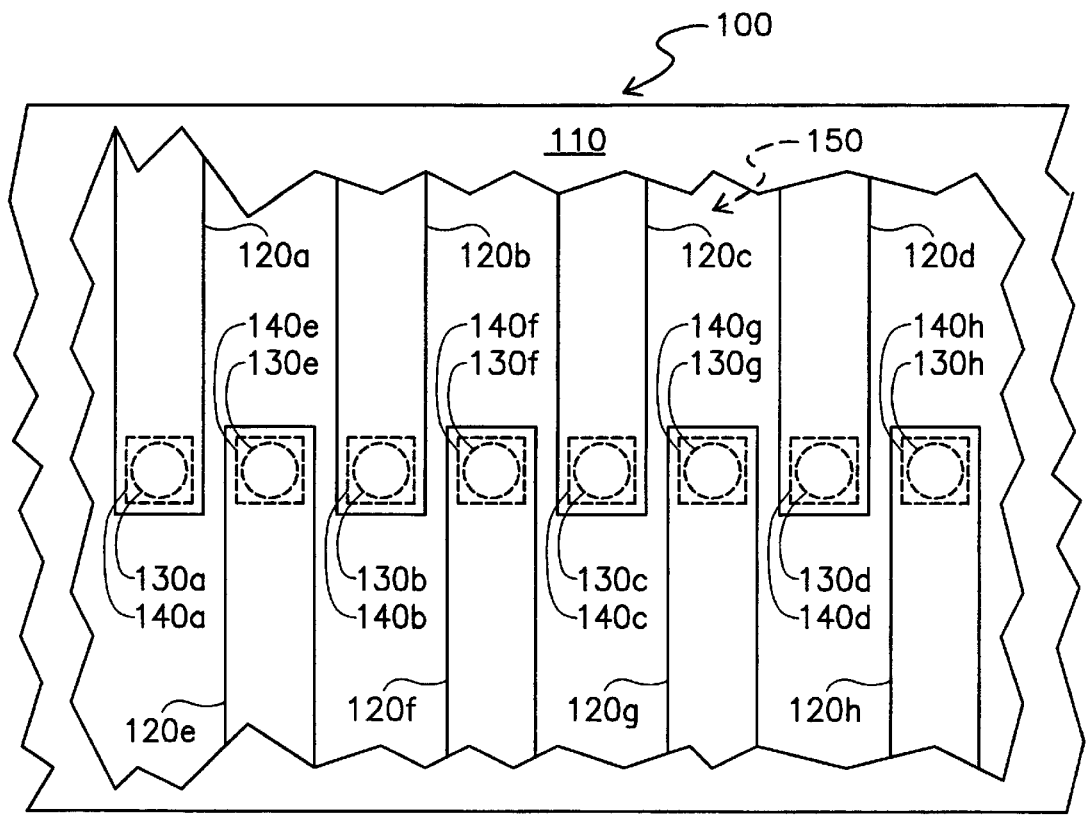
FIGS. 1a and 1b are top (plan) and side views of one embodiment of the present invention.

FIG. 1a is a top view of a semiconductor device package (assembly) 100 according to the present invention. A semiconductor die 150 has a plurality of bond pads (eight shown, can be more) 140a, 140b, 140c, 140d, 140e, 140f, 140g, and 140h, disposed in a line, preferably, but not necessarily, along the centerline of the die 150. Each of a first group of leadframe fingers (conductive leads) 120a, 120b, 120c, and 120d, approaches a respective one of the bond pads 140a, 140b, 140c, and 140d, from a first direction and is connected to the respective bond pad (140a . . . d) via a respective micro-bump connection 130a, 130b, 130c, and 130d.

Each of a second group of leadframe fingers, 120e, 120f, 120g, and 120h, approaches a respective one of the bond pads 120a, 120b, 120c, and 120d, from a second direction opposite the first direction and is connected to the respective bond pads 120e, 120f, 120g, 120h via micro-bump connections 130e, 130f, 130g, and 130h, respectively. The first and second groups of leadframe fingers are arranged such that they connect to the bond pads in an interleaved pattern.

The leadframe (including the leadframe fingers 120a . . . h) and semiconductor die 150 are disposed within a package body 110, and are thermally coupled thereto. By virtue of the leadframe to die connections (comprising leadframe fingers 120a . . . h, micro-bump contacts 130a . . . h, and bond pads 140a . . . h on the die 150) the leadframe is thermally coupled directly to the die. The first and second groups of leadframe fingers are substantially co-planar with one another.

Although the leadframe fingers shown with respect to FIG. 1a form a strictly alternating, interleaved pattern, it is also within the scope and spirit of the present invention that the leadframe fingers may be interleaved in any pattern. It is also within the scope and spirit of the present invention that all leadframe fingers approach the bond pads from the same general direction (e.g., from one side of the package).

According to the invention, the leadframe fingers are made of a highly thermally conductive material with good electrical conduction properties, such as copper (or a copper alloy, gold or its alloys, silver or its alloys, etc.), so that effective heat dissipation (extraction) from the die is provided by the leadframe fingers, without the need for additional heat sinks.

Figure 1B:
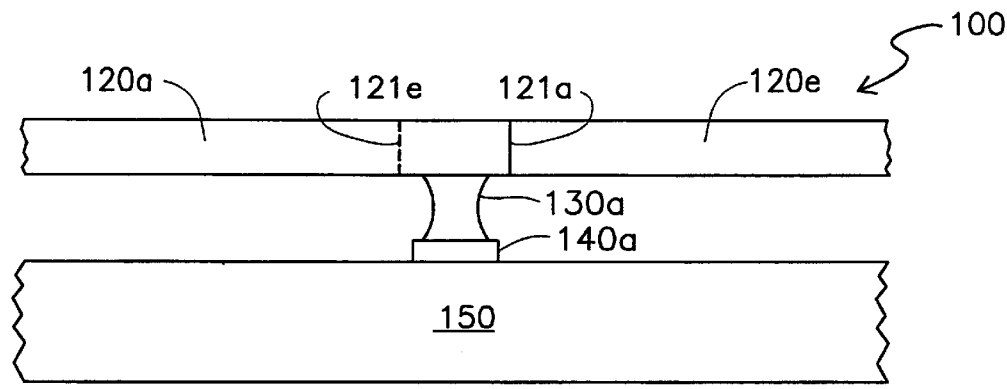

FIG. 1b is a side elevational view of a portion of the semiconductor device package 100 shown in FIG. 1a. A first leadframe finger 120a extends inward from the left (as depicted) and connects to a bond pad 140a on the die 150 via a micro-bump connection 130a. (The use of micro-bumps are set forth herein as exemplary of any direct, or bondwire-less, connection to a leadframe. It is within the scope of this invention that bond wires could be employed instead of leadframe fingers). An end 121a of the leadframe finger 120a extends just over the bond pad 140a. In the background, it is seen that a second leadframe finger 120b extends inward from the right (as depicted, opposite the approach direction of the first leadframe finger 120a). A bond pad connection to the leadframe finger 120e (via a micro-bump connection) is hidden from this view (of FIG. 1b) by the bond pad 140a and micro-bump contact 130a associated with the first bond pad finger 120a. A dashed line shows the position of an end 121e of the leadframe finger 120e just past the bond pad 140a.

The linear configuration (arrangement) of the bond pads serves to reduce thermal displacement of the bond pads in a direction lateral (perpendicular) to the line (row) of bond pads. This causes a corresponding reduction in thermal stress in that (perpendicular) direction between the bond pads and the leadframe. Leadframe fingers tend to be relatively stiff in their longitudinal extent, in this case perpendicular to the row of bond pads, but tend to be relatively flexible in their own lateral direction (i.e., across their ends, or parallel to the row of bond pads).

While longitudinal (along the row) thermally-induced migration of the bond pads is thereby partially accommodated by the orientation of the leadframe fingers vis-a-vis the row of bond pads, enhanced dissipation of heat by the leadframe fingers serves to reduce, ab initio, thermal displacements of the row of bond pads in a longitudinal direction (along the length of their linear configuration), thereby further alleviating any potential problems associated with thermally-induced migration of the bond pads.

Figure 1C:
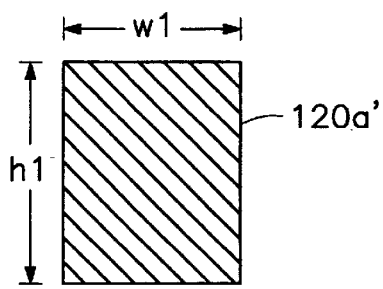
FIGS. 1c and 1d are cross-sectional views of a conductive lead of a leadframe according to the present invention.
Figure 1D:
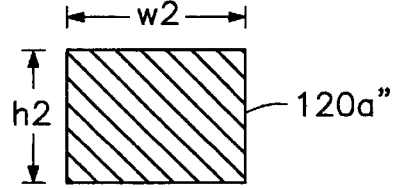

FIGS. 1a and 1b, discussed hereinabove, are directed to the orientation and placement of a leadframe relative to a semiconductor die and bond pads on the die. FIG. 1c and 1d are directed to the cross-sectional shape of the leadframe fingers themselves.

In the prior art, it is known that leadframe fingers are becoming smaller and smaller, more closely spaced together, and formed of ever thinner materials (foils). This, to some extent, is antithetical to the thrust of the heat conductive leadframe of the system of the present invention.

FIG. 1c is a cross-sectional view of a leadframe finger, such as 120a' (FIGS. 1a and 1b), according to the present invention. The leadframe finger 120a' has a height h1 substantially greater than its width w1. In this context "substantially greater than its width" means that the height of the leadframe finger is bigger by a factor of "x" greater than its width, where "x" is, for example, 1.1, 1.2, 1.3, 1.3, 1.5, . . . 3.0. This aspect ratio (height:width) allows the leadframe finger to have substantial thermal mass for extracting heat from the die (via direct connection to an associated bond pad, and by virtue of the leadframe finger's close proximity to the planar surface of the die).

FIG. 1d is a cross-sectional view of another embodiment of a typical leadframe finger 120a", according to the leadframe of the invention, The leadframe finger has a height "h2" to width "w2" ratio of greater than "r", where "r" is, for example, ½, ⅔, ¾, ⅚, ⅞, or 1.0.

Evidently, the leadframe finger 120a" of FIG. 1d has a somewhat smaller height:width aspect ratio than the leadframe finger 120a' of FIG. 1c. With this in mind, it is evident that the leadframe finger 120a" of FIG. 1d is best suited to materials of high thermal conductivity (such as copper or copper alloys) or to circumstances where the leadframe fingers are relatively wide (implying wide bond pad spacing), so that high thermal conductivity of the leadframe fingers may be achieved with a smaller height-to-width ratio. The leadframe finger 120a' of FIG. 1c is best suited to materials of lower thermal conductivity (such as aluminum) or to circumstances where the leadframe fingers must be kept relatively narrow (e.g., due to close bond pad spacing).

It should be recognized that the height-to-width ratio of the leadframe fingers may be used to "tune" their thermal conductivity, and that it is within the scope and spirit of the invention that any suitable leadframe finger height-to-width ratio which yields adequate thermally conductive leadframe fingers can be employed.

Copper is an extremely good thermal conductor, as well as being an excellent electrical conductor. By using copper or another suitable thermal and electrical conductor for a leadframe material, particularly where the leadframe fingers are particularly large or have a high height-to-width ratio, leadframes can be built which have excellent heat sinking properties, as compared to conventional (thin, low thermal mass) leadframes.

In the embodiments discussed hereinabove, each leadframe finger acts as a separate heat sink, drawing heat away from the semiconductor die via its bond pad connection to the die, However, an additional heat dissipation mechanism acts on the leadframe fingers. Heat radiated from the surface of the die (or conducted via an encapsulant, e.g., a thermally conductive plastic or epoxy molded package body) is carried away from the die by each leadframe finger, by virtue of the leadframe finger's close proximity to the surface of the die.

In the examples set forth in FIGS. 1a and 1b, the leadframe fingers stopped substantially at the bond pads. In other words, the leadframe fingers were shown extending only about halfway across the surface of the die (assuming that the bond pads were arranged substantially on a centerline of the die).

According to an aspect of the invention, it is advantageous to allow (advertently cause) the leadframe fingers to extend past the bond pads over at least a portion of the remaining surface of the die to improve this radiative (or conductive) thermal coupling to the surface of the die. (There will evidently be additional thermal mass associated with a leadframe finger that extends past the bond pad versus one that simply stops at the bond pad, all other factors being equal). Such a configuration is shown and described hereinbelow with respect to FIG. 2a and 2b.

Figure 2A:
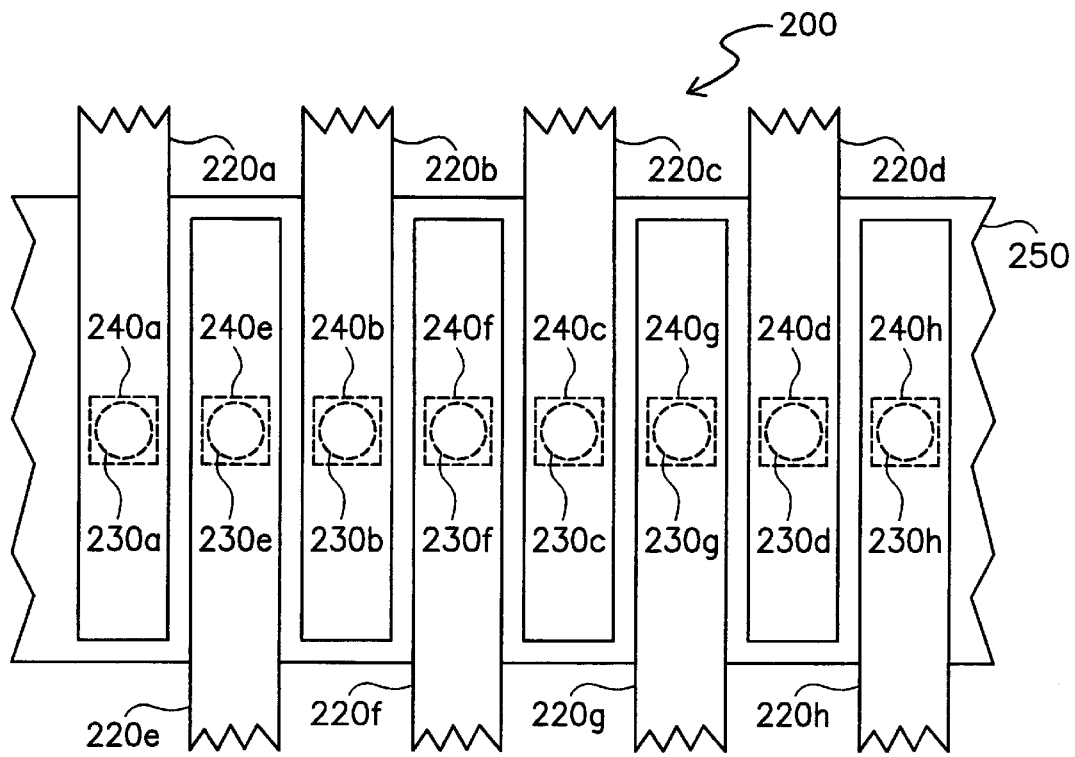
FIGS. 2a and 2b are top and side views, respectively, of an alternate embodiment of the present invention.

FIG. 2a is a top view of a portion of a semiconductor device package (assembly) 200. (The assembly 200 is similar to the assembly 100 of FIG. 1a, but a package body (110) is omitted, for illustrative clarity.) A semiconductor die 250 has a plurality of bond pads 230a, 230b, 230c, 230d, 230e, 230f, 230g, and 230h (eight shown, can be more) disposed in a line which preferably, but not necessarily, passes through (over) the centroid of the die 250. Each of a first group of leadframe fingers 220a, 220b, 220c, and 220d extend across the surface of the die 250 from a first direction (from the top, as shown in the Figure) and connect to bond pads 240a, 240b, 240c, and 240d, respectively, via micro-bump connections 230a, 230b, 230c, and 230d, respectively. In contrast to the embodiment of FIG. 1a (wherein the leadframe fingers were shown extending only approximately to the respective bond pad), in this case the first group of leadframe fingers extend substantially past the bond pads at least an additional portion of the distance across the die 250 over the surface of the die 250. Similarly, each of a second group of leadframe fingers 220e, 220f, 220g, and 220h extend across the surface of the die 250 from a second direction (from the bottom, as shown in the Figure) and connect to bond pads 240e, 240f, 240g, and 240h, respectively, via micro-bump connections 230e, 230f, 230g, and 230h, respectively. The second group of leadframe fingers extend substantially past the bond pads at least an additional portion of the distance across the die 250 and over the surface of the die 250.

The additional extension of the leadframe fingers 220a . . . h is such that each leadframe finger 220a . . . h extends over the surface of the die 250 at least x% of the distance across the die 250, where x is, for example, 60%, 70%, 80%, 90%, or 100% (including cases where the leadframe finger extend beyond the die periphery). This is in contrast to the leadframe fingers 120a . . . h (of FIG. 1a) which extended only approximately 50% of the distance across the die (assuming that the bond pads 140a. . . h were disposed on a centerline of the die).

As mentioned above, extending further across the die provides the leadframe fingers 220a . . . h with additional thermal mass and additional surface area presented to the die to collect heat from the die 250. Extended leadframe fingers (e.g., 220a . . . h) also provide for secondary heat coupling (e.g., radiative) of the die to the leadframe fingers.

Figure 2B:
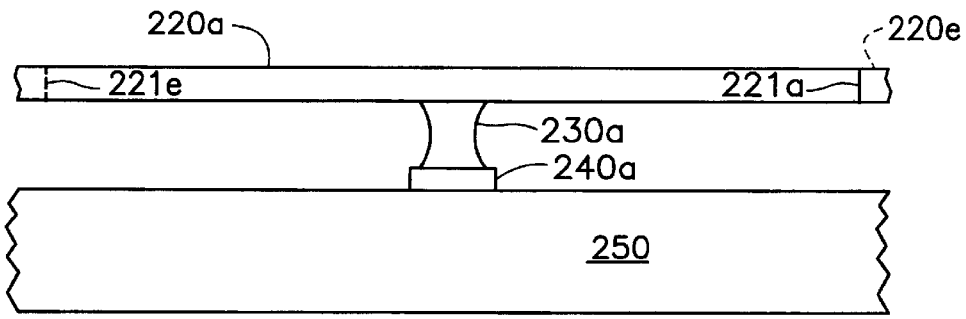

FIG. 2b is a side view of the arrangement described with respect to FIG. 2a (compare FIG. 1b), illustrating that ends 221a and 221e of the leadframe fingers 220a and 220e, respectively, extend considerably past their respective bond pad connections across the surface of the die 250. (Compare with 120a, 121a and 120e, 121e, FIGS. 1a and 1b).

This technique provides additional thermal conductivity of and heat dissipation by the lead fingers with respect to the die (i.e., greater dissipation via the leadframe fingers of heat produced in the die). Preferably, the leadframe material is copper, or other suitable high thermal and electrical conductivity material. Using this configuration, however, it is possible to improve the thermal conductivity of the leadframe fingers to the die so that leadframe materials of lower thermal conductivity, such as aluminum, may be employed.

Figure 2C:
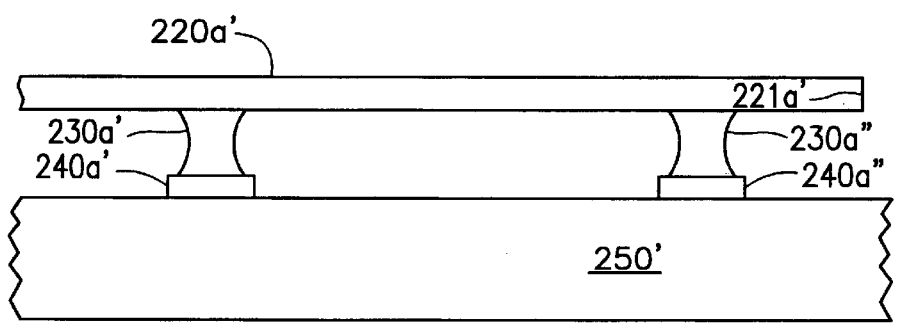
FIG. 2c is a side view of still another embodiment of the present invention.

FIG. 2c is a side view of yet another embodiment of the invention. In this embodiment, a single leadframe finger 220a' is thermally connected to a die 250' via two microbump connects 230a' and 230a" to two bond pads 240a' and 240a", respectively. An end 221a' of the leadframe finger 220a' extends at least far enough across the surface of the die 250' to permit connection to both bond pads 240a' and 240a". The connection to two bond pads (240a' and 240a") provides greater thermal coupling of the leadframe 220a' to the die 250' than that provided in other embodiments shown and described hereinabove (compare with, e.g., 220a, 230a, 240a, 250, with respect to FIGS. 2a and 2b).

In this embodiment, one of the bond pads (e.g., 240a') and micro-bump connections (e.g., 230a') may be used to provide an electrical connection of the leadframe finger 220a' to a circuit element (not shown) on the die 250', while the other bond pad (e.g., 240a") and micro-bump contact (e.g., 230a") may simply be a "dummy" bond pad and bump contact on the surface of the die 250' which makes no electrical connection to circuitry on the die 250', but which provides additional thermal conductivity to the die 250'. It is not necessary, however, that either microbump contact be a "dummy" contact. Both contacts (e.g., 230a' and 230a") may provide electrical connection to the same circuit element on the die, for example, to reduce effective contact resistance to a circuit element. This is particularly advantageous with respect to power supply connections, which tend to carry more current than other connections.

While FIG. 2c shows only (a group of) two bond pads (240a' and 240a") and two micro-bump connections thereto (230a' and 230a", respectively), if will be readily appreciated by one of ordinary skill in the art that three or more such connections may be similarly employed to further improve thermal conductivity between a die (e.g., 250') and a leadframe finger (e.g., 220a').

The aspect ratio features of the invention, described with respect to FIGS. 1c and 1d are equally applicable to the overreaching (extended well beyond the bond pads) and multiple connected leadframe fingers of FIGS. 2a–2c.

The principles described hereinabove, of removing heat from the die at the point of connection to the die, tend to relieve thermally created stresses at the bond pads on the surface of the die by reducing the die temperature in the immediate vicinity of the bond pads (and elsewhere), thereby reducing the amount of thermal displacement they experience.

In the event that circuits on the die are not located conveniently for connection to the bond pads, existing and/or additional wiring layers may be employed to route signals from the circuits to the bond pads.

It is within the scope and spirit of the present invention that the techniques described hereinabove be used either alone or in combination. For example, it is within the scope of the invention to extend only a portion of the leadframe fingers over the surface of the die past the bond pads. In other words, some of the leadframe fingers would be like the leadframe fingers 120a . . . h, and other of the leadframe fingers would be like the leadframe fingers 220a . . . h. It is also within the scope of the present invention that any leadframe material, including copper, alloys, or plated materials, having sufficient thermal and electrical conductivity to effect the desired result may be employed.

As mentioned hereinabove, an overall goal of the present invention is to remove heat generated in a semiconductor device with a thermally conductive leadframe that serves both as electrical circuit conductors and as a thermal heat conduit to an external heat sink.

Many other combinations of features, some of which have been expressly set forth hereinabove, are within the spirit and scope of this invention and may be advantageously utilized in SCM, MCM, and BLP systems as contemplated herein. It is contemplated, and within the scope of the invention, that the present invention effectively utilize the thermally conductive leadframe described hereinabove.

Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMs, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alarms;

(e) information data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and adapted for connection to external systems. This usually involves mounting the die to some sort of substrate, lead frame or carrier, connecting the bond pads on the die to some sort of conductive leads or traces and fornming a package body around the die. The conductive leads or traces exit the package body, and usually terminate in external leads, pins or solder balls.

Figure 3:
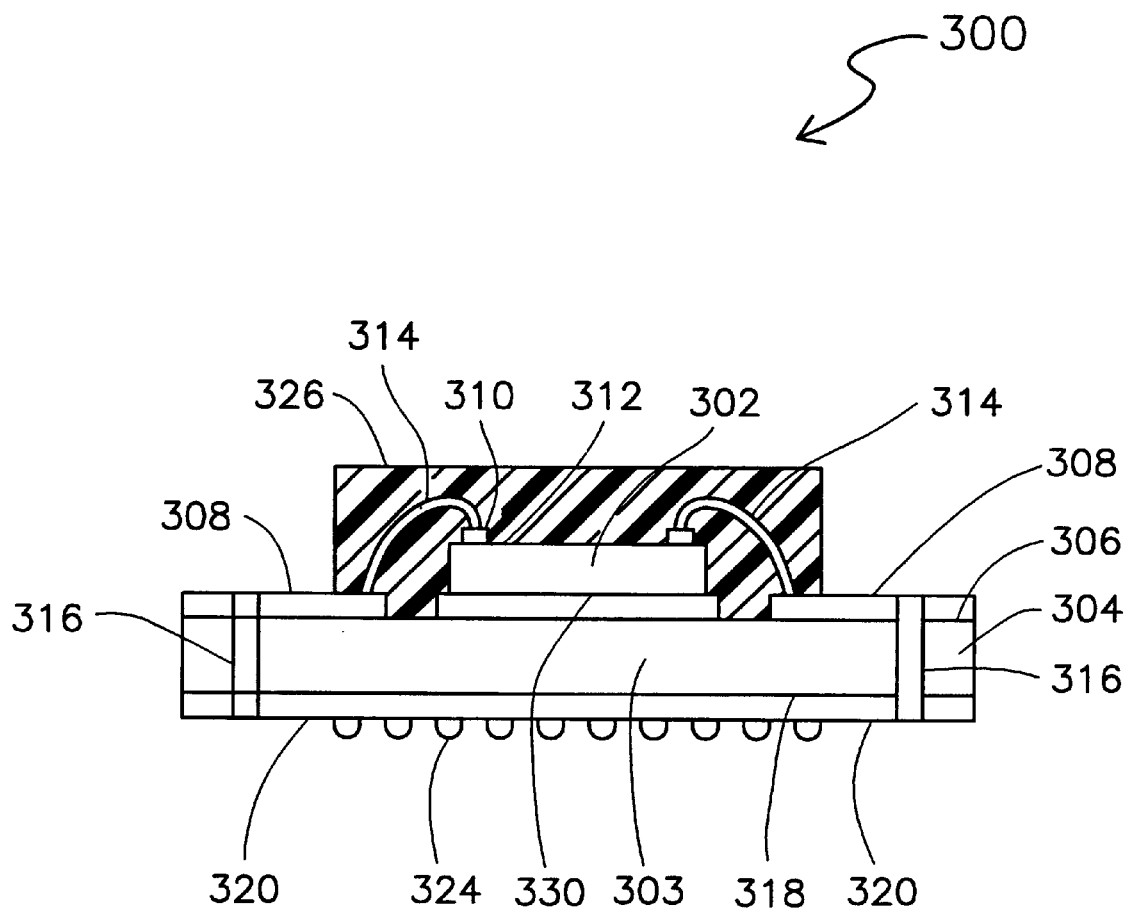
FIG. 3 is a schematic elevational view of a single chip module illustrated in cross section.

Referring to FIG. 3, a schematic elevational view of a SCM is illustrated in cross section. The SCM 300, as illustrated, is a ball bump grid array semiconductor package. A semiconductor die 302 is mounted to the top surface of a central area 303 of a substrate 304. The semiconductor die has conductive lines 312 formed thereon (not illustrated). The top surface 306 of the substrate 304 is provided with a number of conductive traces 308 that extend from near the periphery of the substrate 304 to the central area 303. The die 302 has bond pads 310 thereon. Bond wires 314 extend from the bond pads 310 to inner ends of the traces 308. Near the periphery of the substrate 304, there are plated (conductive) through-holes (vias) 316 extending from the bottom surface 318 of the substrate 304, through the substrate to a respective trace 308. The bottom surface 318 of the substrate is provided with a number of conductive traces 320, each having an end connected with a respective via 316. In this manner, signals (and power) to and from the die are connected through the bond wires 314, through the top side traces 308, through the vias 316, to the bottom side traces 320. Solder balls 324 are attached to the traces 320. A package body 326 is formed over the die 302, and partially covers the top surface of the substrate 304.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 304 of FIG. 3) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 4:
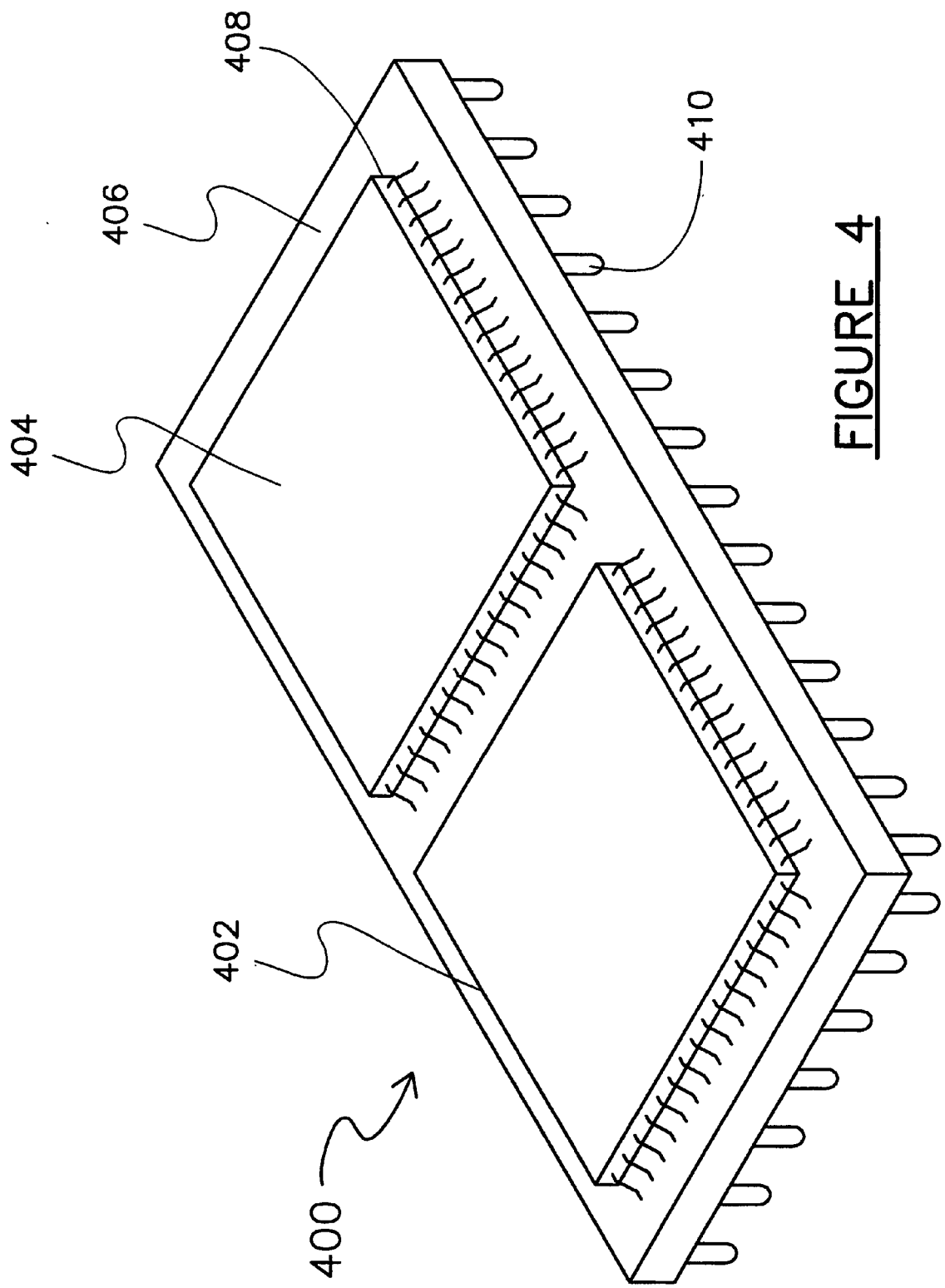
FIG. 4 is a schematic perspective view of a multi-chip module.

FIG. 4 illustrates a schematic perspective view of a MCM. MCM 400 comprises a substrate 406 having conductive lines formed thereon (not illustrated), at least two semiconductor dies 402 and 404 disposed on the substrate 406 and electrically connected to conductive lines (not illustrated) of the substrate 406 by the outer tips of lead frame leads 408. The dies 402 and 404 may be physically mounted to the substrate 406. The two semiconductor dies 402 and 404 are illustrated encapsulated, however, non-encapsulated flip-chip ball bump dies are also contemplated. One or more layers of conductive traces and plated through-holes (not illustrated) may be disposed within substrate 406 and are used to connect the semiconductor dies 402 and 404 to one another and to external connections 410, such as the solder ball bump structures as described above. Additional electrical components, such as capacitors, resistors and inductors (not illustrated) may also be disposed on and connected to the substrate 406. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 5:
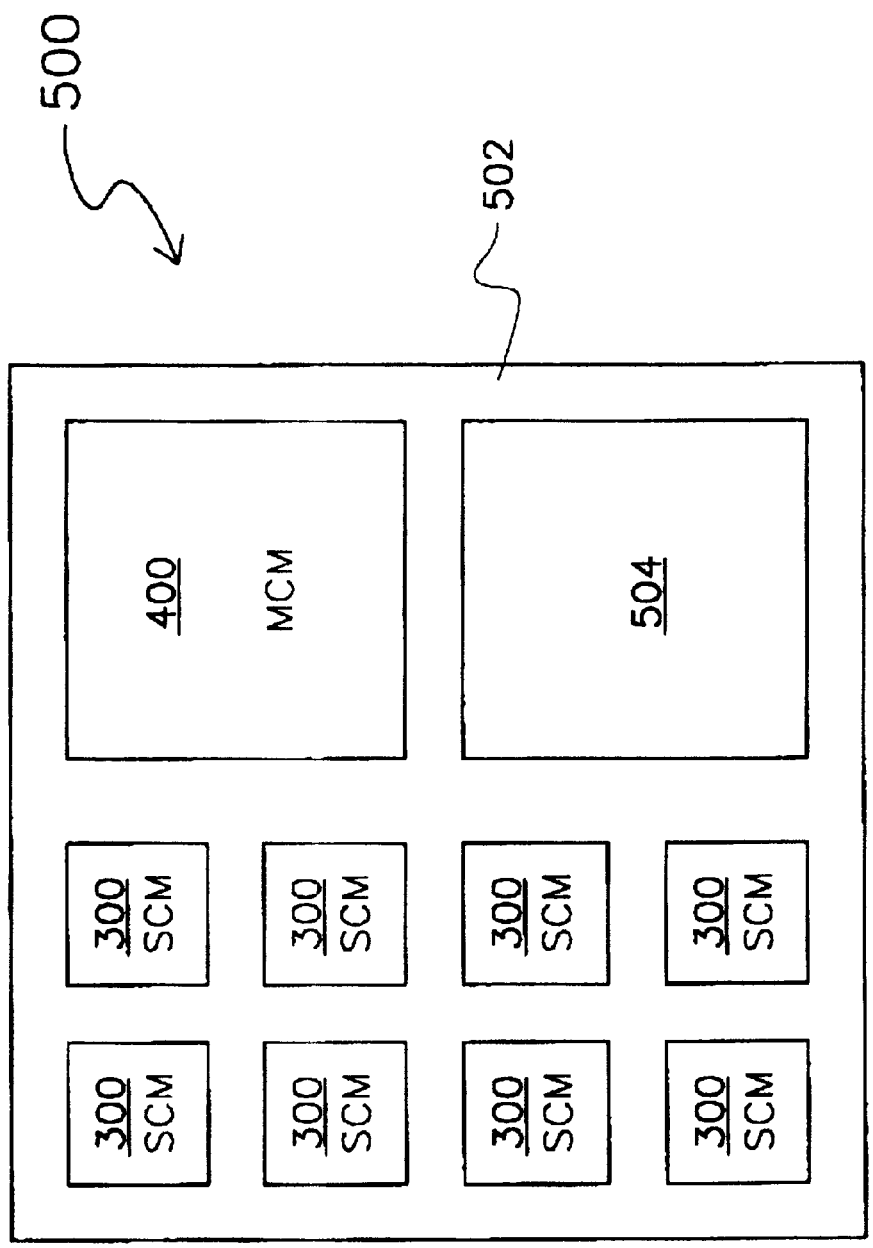
FIG. 5 is a schematic top view of a board level product.

FIG. 5 illustrates a schematic top view of a board level product (BLP). The BLP 500 comprises an array of SCMs 300, a MCM 400, and a memory component 504. The SCMs 300, the MCM 400, and memory 504 are each disposed on and connected to a printed wiring board 502. The printed wiring board 502 provides for all connections between those components. Examples of BLPs include central processing unit boards, memory boards, and interface boards (as are routinely utilized in computer systems).

Boxes are also system level products which may include a combination of SCMs, MCMs, BLPs, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Figure 6:
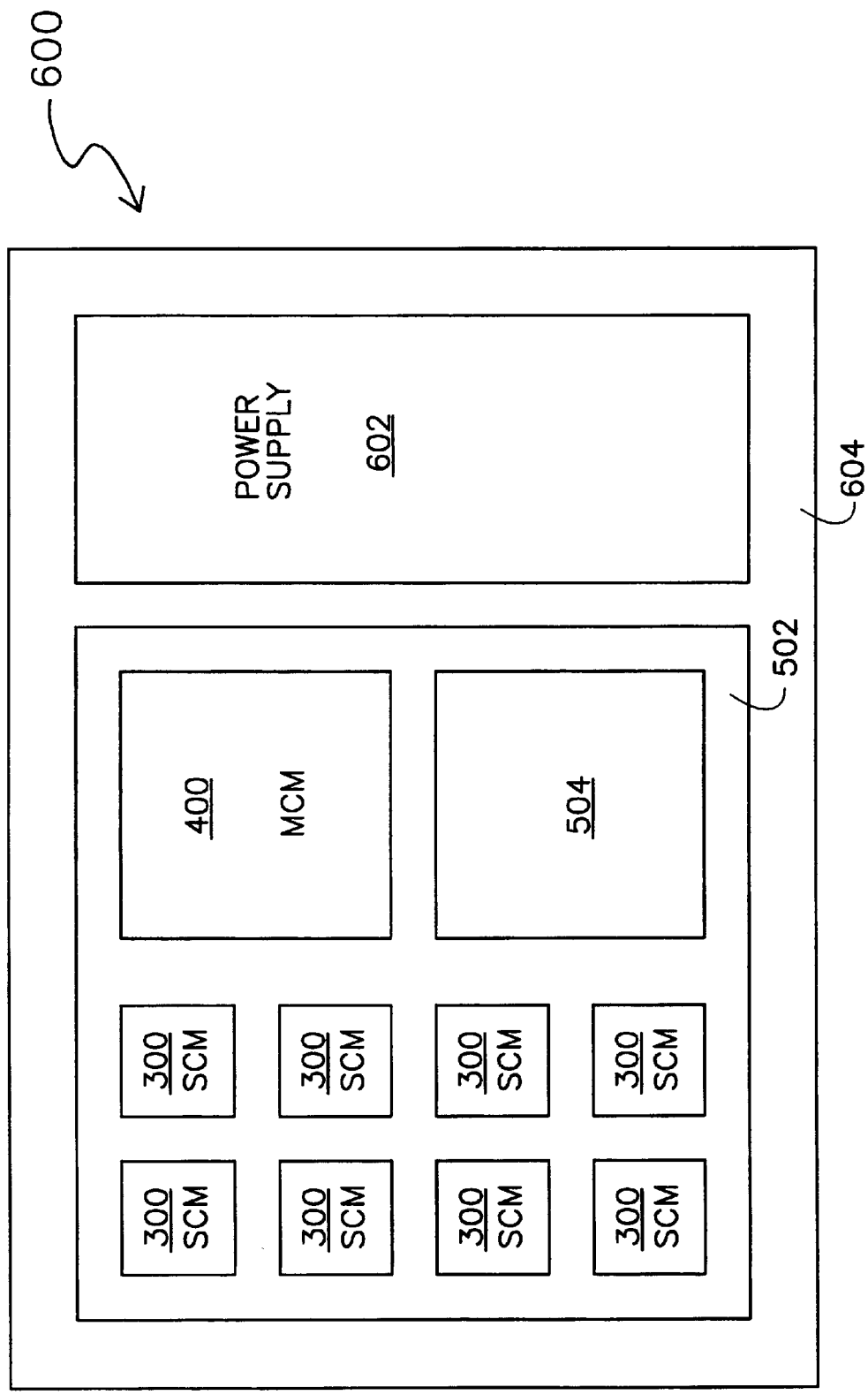
FIG. 6 is a schematic top view of a box level product.

FIG. 6 illustrates a schematic top view of a box level product. The box level product 600 comprises at least one printed wiring board 502 as described above, a power supply 602 and an enclosure or box 604 containing the at least one board 502 and the power supply 602. One or more box level products may be used to create more complex systems according to the present invention.

Figure 7:
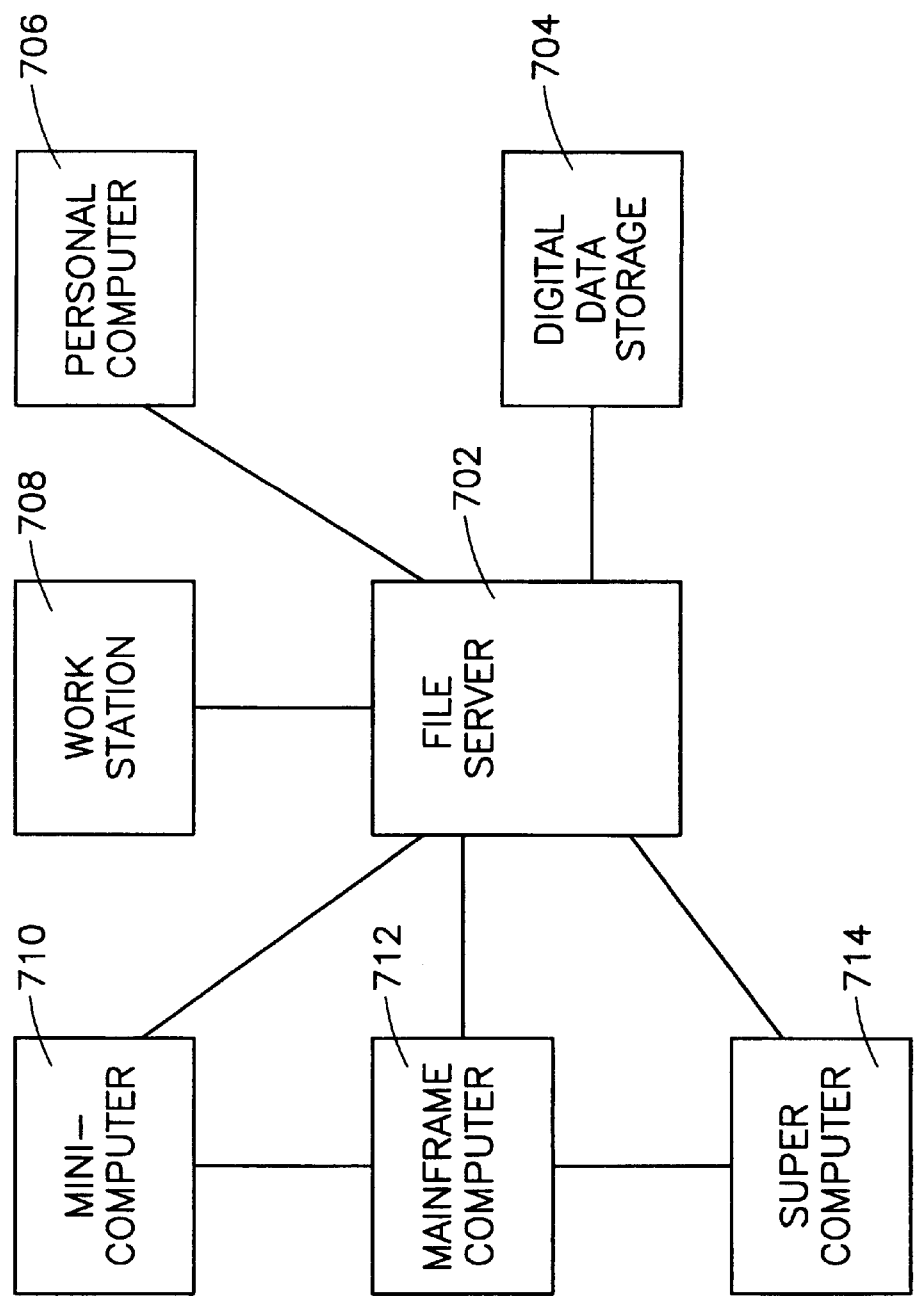
FIG. 7 a schematic block diagram of a computer system.

FIG. 7 illustrates a schematic block diagram of various computer systems interconnected together via various digital data transmission systems. A file server 702 is connected to a digital data storage device 704 such as, for example, magnetic hard disk, tape, optical disk, flash memory, core memory, semiconductor memory and the like. The server 702 may be connected to at least one personal computer 706, a work station 708, a minicomputer 710, a mainframe computer 712, and a super computer 714 through a number of digital data transmission system networks such as token ring, star, coaxial, fiber-optic and the like. These networks may utilize data protocols such as Scaleable Coherent Interface ("SCI"), ANSI/IEEE Std 1596–1992 SCI, Asynchronous Transfer Mode ("ATM"), FiberChannel, SerialBus, SCSI, SSA, QuickRing, HIPPI, FDDI, Ethernet and the like.

Figure 8:
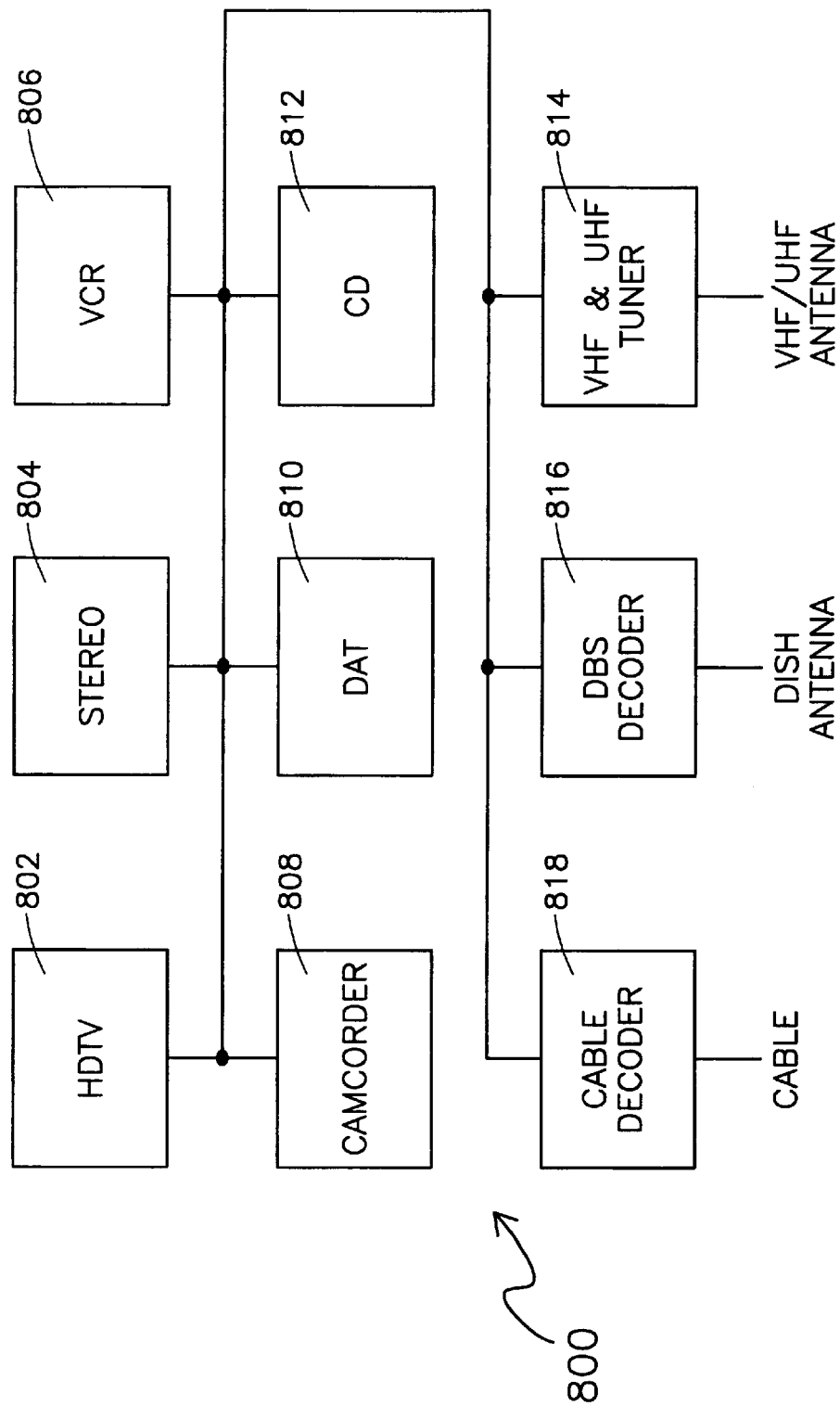
FIG. 8 a schematic block diagram of an entertainment system.

FIG. 8 is a schematic block diagram of an entertainment system according to the present invention. The entertainment system 800 may be comprised of the following component subsystems: a high definition television (HDTV) 802, a stereo 804, a video cassette recorder (VCR) 806, a television camera/recorder (Camcorder) 808, a digital audio tape unit (DAT) 810, a compact disk player (CD) 812, a VHF/UHF tuner 814, a direct broadcast satellite (DBS) decoder 816, and a cable decoder 818. These component subsystems are made up of SCM, MCM, BLP and boxes as disclosed above.

Figure 9:
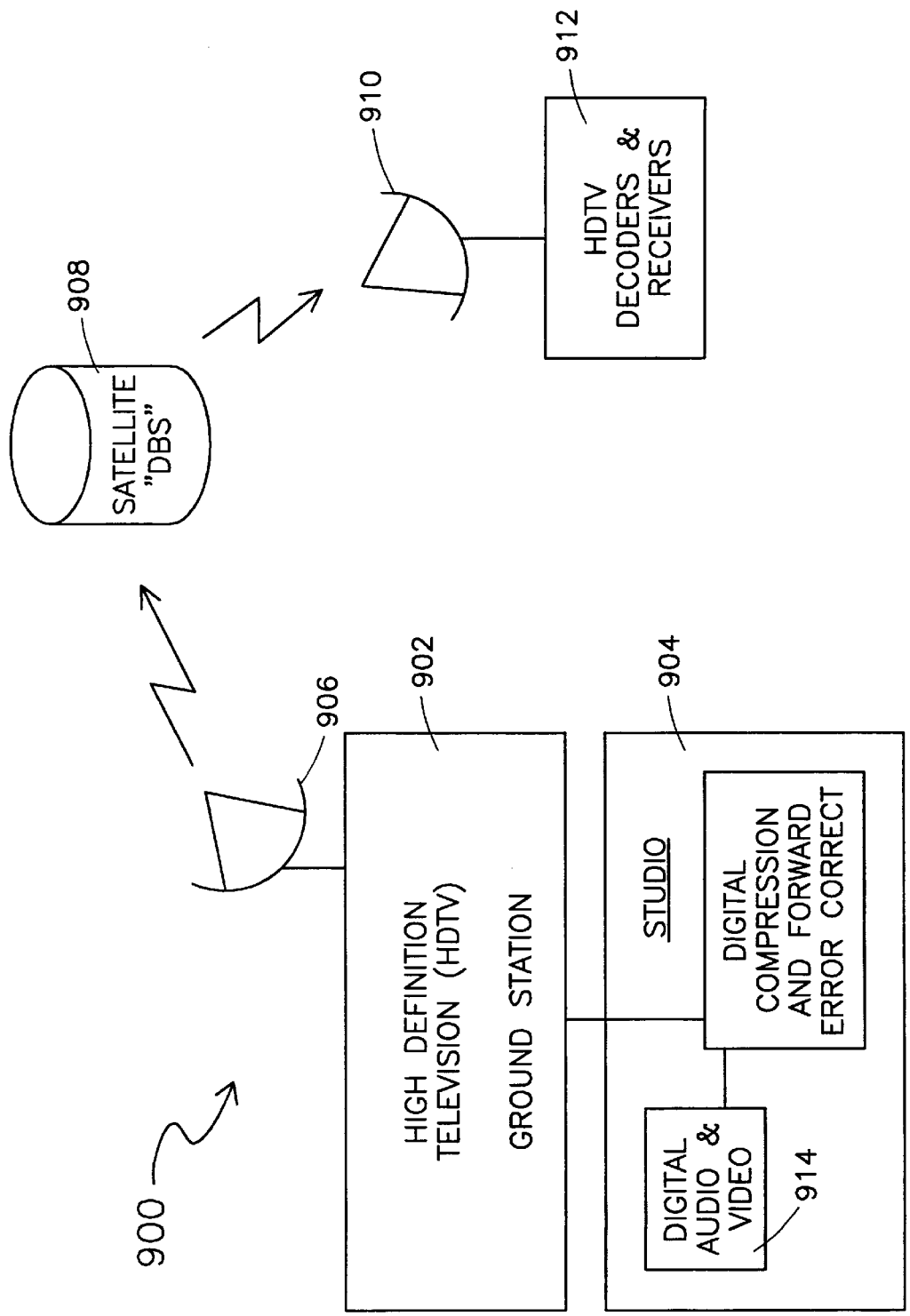
FIG. 9 is a schematic block diagram of an information and entertainment transmission system.

The DBS decoder 816 receives a digitally encoded and forward error corrected signal from a dish antenna (not illustrated) which receives a DBS entertainment signal from a geosynchronous satellite (see FIG. 9). Hardwired cable is connected to the cable decoder 818 which decodes and converts the cable entertainment channels to signals for viewing on the HDTV 802 or a standard television (not illustrated). Standard broadcast television and stereo signals may be received by the VHFUHF tuner 814 and the base band signals made available to the HDTV 802, stereo 804 and the other recording devices (VCR 806, DAT 810). Similarly, recorded entertainment information may be played on the HDTV 802 and stereo 804 from the playback devices (DAT 810, Camcorder 808, CD 812, VCR 806) for viewing and listening enjoyment by the user.

FIG. 9 is a schematic block diagram of an information and entertainment communications system according to the present invention. The information and entertainment communications system 900 is comprised of the following systems: A HDTV ground station 902 which transmits a digitally encoded and forward error corrected signal from the HDTV studio 904 by microwave dish 906 to a DBS satellite 908. The satellite 908 rebroadcasts the signal from the studio 904 to a plurality of ground station dish antennas 910 which are connected to corresponding HDTV receivers/decoders 912 where the DBS satellite signal is processed and made available, for example, to the entertainment system 800. The system 900 is comprised of many SCM, MCM, BLP and box level subsystems which greatly benefit from the features, aspects and advantages of the present invention. Some of these subsystems are a digital audio and video formatting subsystem 914 which convert the analog entertainment information into a digital format, and a digital compression and forward error connection subsystem 916 which prepares the digitally encoded entertainment information for transmission by the ground station 902 to the satellite 908.

Figure 10:
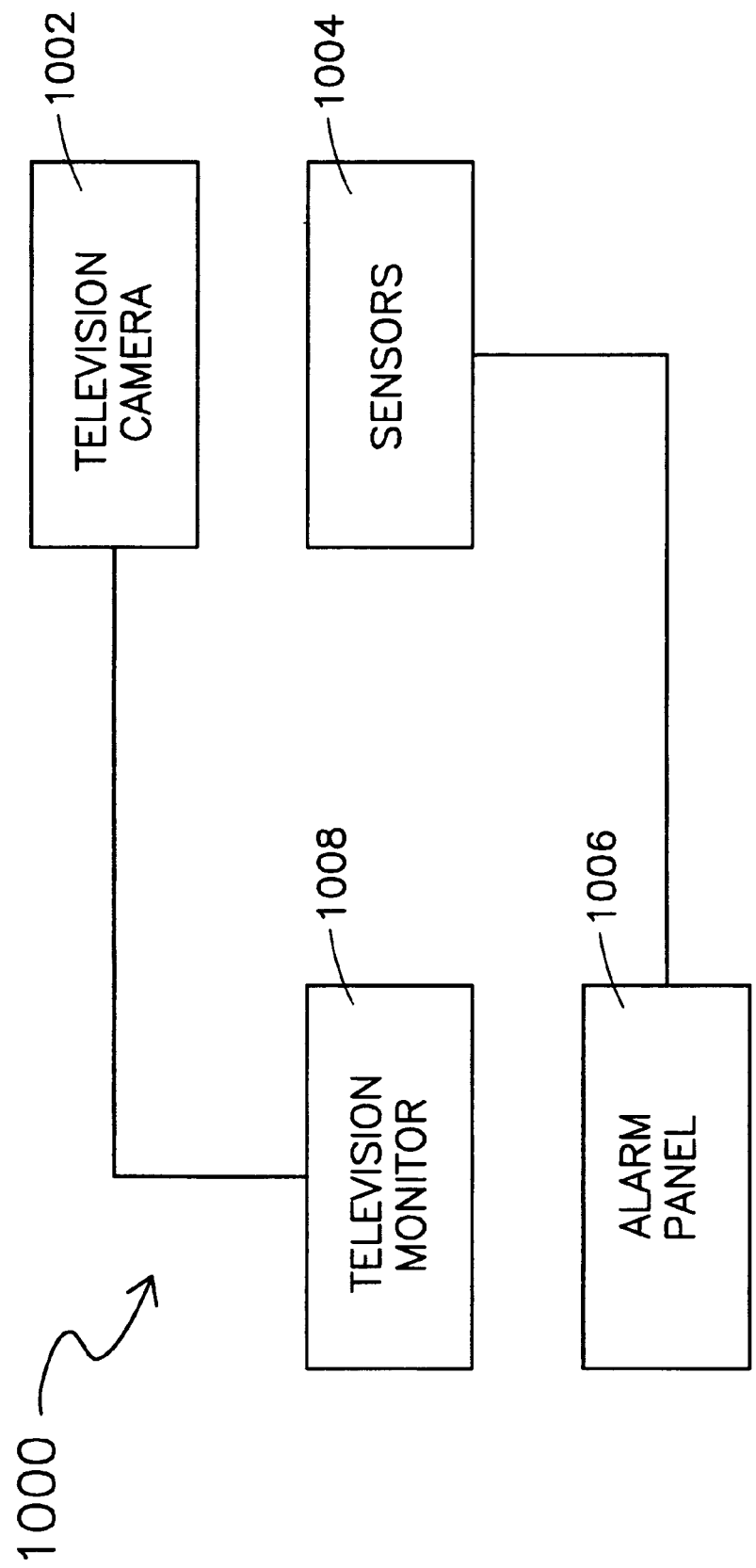
FIG. 10 is a schematic block diagram of a security and surveillance system.

FIG. 10 is a schematic block diagram of a security and surveillance system according to the present invention. The security and surveillance system 1000 is comprised of the following subsystems: A television camera 1002, intrusion detection sensors 1004, a sensor alarm panel 1006, and a television monitor 1008. The television monitor 1008 displays what the television camera(s) 1002 observe. The alarm panel 1006 displays the status of the sensors 1004 and will annunciate an alert upon a sensed alarm condition. The system 1000 may be utilized in homes, businesses, government building, military bases, prisons and any area requiring security and surveillance.

Figure 12:
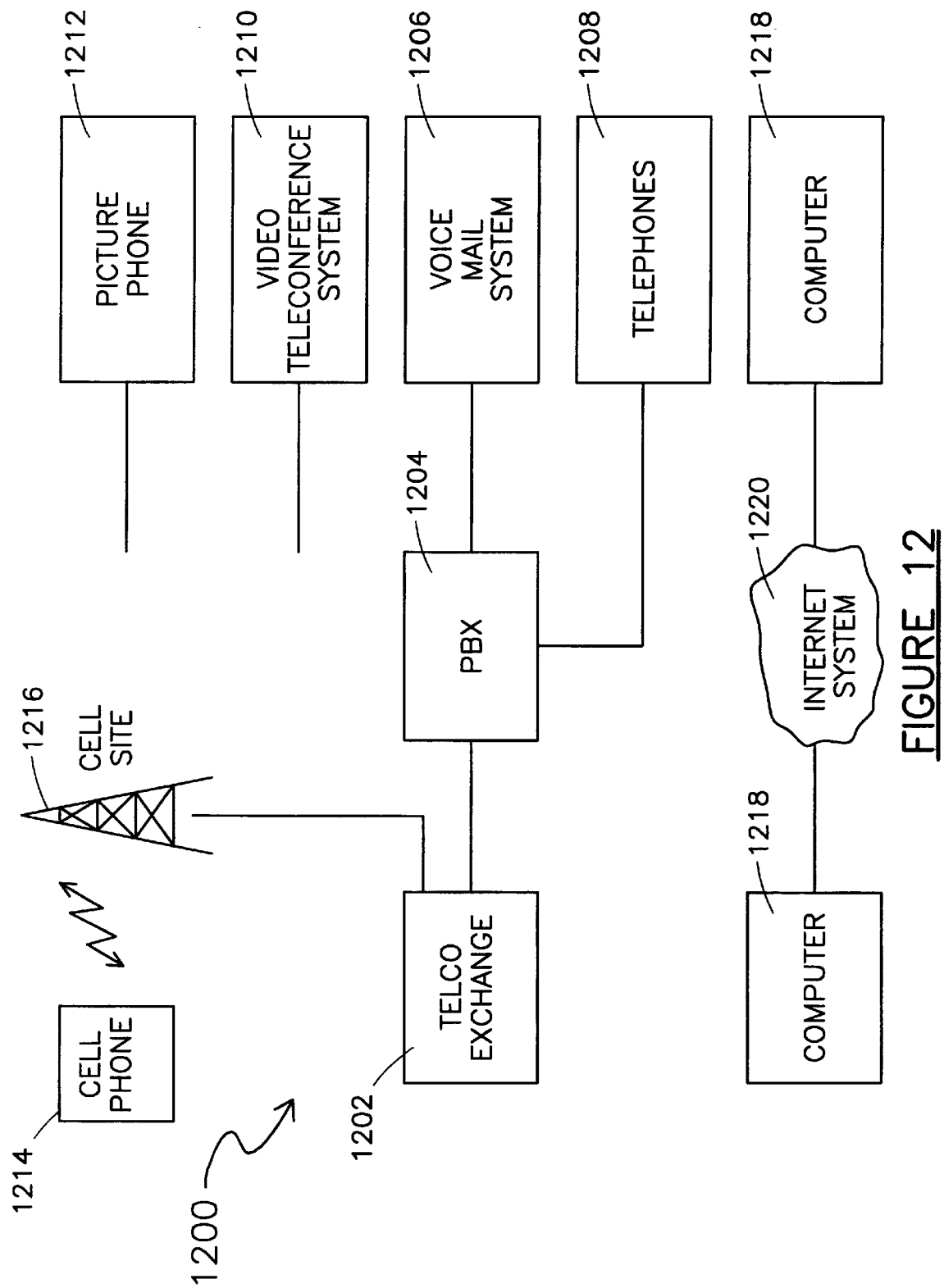
FIG. 12 is a schematic block diagram of a plurality of communications and information transmission systems.

In addition, another embodiment of the security and surveillance system 1000 may be utilized to monitor operating conditions of transportation systems such as engine status, hull integrity, operating temperatures, maintenance evaluation and other parameters deemed necessary for the safe and efficient operation of the transportation systems (see FIG. 12). In a further embodiment of subsystems for the transportation systems, positioning and navigational (GPS) systems may be utilized for hazard avoidance, as well as radar and sonar (see FIG. 12). Further, operation of the transportation systems may be implemented by digital control, such as "fly-by-wire," along with the monitoring thereof The system 1000 and its subsystems may be utilized with the other system embodiments disclosed herein and will greatly benefit from the features, aspects and advantages of invention as disclosed hereinabove.

Figure 11:
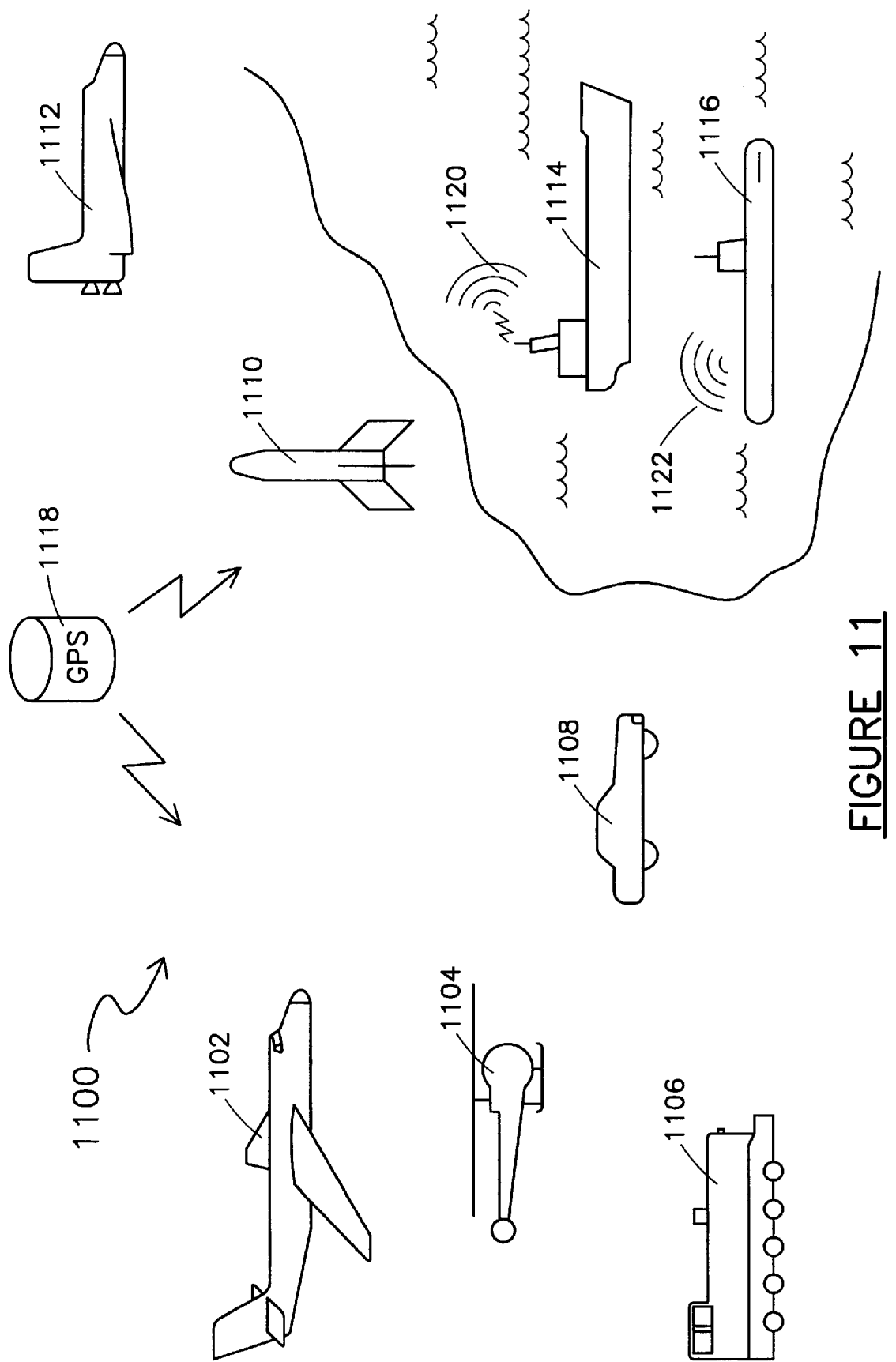
FIG. 11 is a schematic block diagram of a plurality of transportation systems.

FIG. 11 is a schematic block diagram of a plurality of transportation systems according to the present invention. The transportation systems, generally referenced to by the numeral 1100, may utilize, individually or in combination, the aforementioned systems to great advantage. Embodiments of the transportation system 1100 is as follows: An airplane 1102, a helicopter 1104, a train 1106, a vehicle 1108 such as an automobile or truck, a rocket 1110, a space shuttle 1112, a ship 1114, a submarine 1116, and the like. Each of the embodiments of the transportation systems 1100 contemplated herein may greatly benefit from the communications, navigation and control systems disclosed herein along with he features, aspects and advantages of the present invention.

Each of the embodiments of the transportation systems 1100 may utilize a positioning and navigation system which derives its position information from a global positioning satellite system (GPS) 1118. The positioning and navigation system is comprised of SCM, MCM, BLP and box level systems as discussed hereinabove. Radar 1120 and/or sonar 1122 systems may be utilized for collusion avoidance and location and may be incorporated with any of the transportation systems 1100.

FIG. 12 is a schematic block diagram of a plurality of communications and information transmission systems according to the present invention. The communications and information transmission systems 1200 may comprise, individually or in combination, a telephone exchange 1202, a PBX 1204, a voice mail system 1206, telephones 1208, a video teleconferencing system 1210, a video picture telephone 1212 and the like. The systems 1200 may also comprise a cellular telephone 1214, and a plurality of cell sites 1216 which may be connected with the telephone system 1202. Further, systems 1200 may be computers 1218 connected together through the internet system 1220. Both analog and digital communications are contemplated herein with the various features, advantages and aspects of the present invention.

Other MCM, SCM, mini-board, micro-board, board level and other system sub-assemblies are contemplated using the heat dissipating leadframes of the present invention. Additionally, such subassemblies or packages using such heat dissipating leadframes may be used with traditional circuit boards or sub-assemblies for a system level product. Examples of electronic systems that may benefit from the system and method of the present invention have been mentioned above. The spirit and intent of the present invention is to utilize heat dissipating leadframes in all electronic systems from a single semiconductor integrated circuit die to a complex multiple box electronic system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An electronic system using a semiconductor device assembly having a heat-dissipating leadframe, said system comprising:
    at least one semiconductor device assembly comprising;
        a semiconductor die having a surface, a longitudinal dimension and a lateral dimension;
        a row of bond pads disposed on the surface of the semiconductor die, the row of bond pads including at least one first bond pads and at least one second bond pads;
        a leadframe made of a thermally conductive material, said leadframe including a first leadframe finger and a second leadframe finger;
        said first leadframe finger approaching a first corresponding bond pad from a first direction across the surface of the semiconductor die and extending at least to the first corresponding bond pad;
        said second leadframe finger approaching a second corresponding bond pad from a second direction across the surface of the semiconductor die and extending at least to the second corresponding bond pad;
        a portion of each leadframe finger extending past the corresponding bond pad and across at least a remaining portion of the lateral dimension across the surface of the semiconductor die, each leadframe finger thereby spanning at least 60% of the lateral distance across the die; and
        a connection formed between each leadframe finger and the corresponding bond pad.

2. The system of claim 1, wherein the second direction is substantially opposite the first lateral direction.

3. The system of claim 1 wherein the thermally and electrically conductive material is copper.

4. The system of claim 1, wherein each leadframe finger has a height to width ratio of greater than 1:2.

5. The system of claim 1, wherein each leadframe finger has a height to width ratio of greater than 2:3.

6. The system of claim 1, wherein each leadframe finger has a height to width ratio of greater than 3:4.

7. The system of claim 1, wherein each leadframe finger has a height to width ratio of greater than 7:8.

8. The system of claim 1, wherein each leadframe finger has a height to width ratio of greater than 2:1.

9. The system of claim 1, wherein each extended leadframe finger extends laterally at least 70% of the distance across the die.

10. The system of claim 1, wherein each extended leadframe finger extends laterally at least 80% of the distance across the die.

11. The system of claim 1, wherein each extended leadframe finger extends laterally at least 90% of the distance across the die.

12. The system of claim 1, wherein each extended leadframe finger extends laterally at least 100% of the distance across the die.

13. The system of claim 1, wherein the thermally and electrically conductive material is copper.

14. The system of claim 1, wherein the thermally and electrically conductive material is aluminum.

15. The system of claim 1, wherein all of the leadframe fingers extend beyond corresponding bond pads, at least a substantial portion of the lateral distance across the die.

16. The system of claim 1, wherein the electronic system is a single chip module.

17. The system of claim 1, wherein the electronic system is a multi-chip module having at least one semiconductor device.

18. The system of claim 1, wherein the electronic system is a board level product having a plurality of semiconductor devices on at least one printed wiring board.

19. The system of claim 1, wherein the electronic system is a box level system having a plurality of semiconductor devices on at least one printed wiring board mounted into a box with a power source.

20. The system of claim 1, wherein the electronic system is a computer system.

21. The system of claim 1, wherein the electronic system is an information and entertainment transmission system.

22. The system of claim 1, wherein the electronic system is an entertainment system.

23. The system of claim 1, wherein the electronic system is a security and surveillance system.

24. The system of claim 1, wherein the electronic system is an information, data acquisition and control system.

25. The system of claim 1, wherein the electronic system is utilized in a transportation system.

* * * * *